United States Patent [19]

Hayes et al.

[11] Patent Number: 5,386,195
[45] Date of Patent: Jan. 31, 1995

[54] METHOD AND APPARATUS FOR MONITORING AN ELECTRICAL PROPERTY OF A CONDUCTIVE COATING

[75] Inventors: David V. Hayes, Campbell; Robert S. Wagner, Corning, both of N.Y.

[73] Assignee: Corning Incorporated, Corning, N.Y.

[21] Appl. No.: 163,582

[22] Filed: Dec. 7, 1993

Related U.S. Application Data

[63] Continuation of Ser. No. 959,726, Oct. 13, 1992, abandoned.

[51] Int. Cl.$^6$ ............................................. G01R 27/26
[52] U.S. Cl. ..................................... 324/662; 427/10
[58] Field of Search ................... 324/662, 671, 696; 427/8, 9, 10

[56] References Cited

U.S. PATENT DOCUMENTS

| | | | |
|---|---|---|---|
| 3,535,631 | 10/1970 | De Geest et al. | 324/671 |
| 3,609,735 | 9/1971 | Dauterman | 324/662 |
| 5,057,781 | 10/1991 | Atkins et al. | 427/10 |
| 5,093,626 | 3/1992 | Baer et al. | 324/671 |
| 5,140,274 | 8/1992 | Wertz et al. | 324/671 |

OTHER PUBLICATIONS

Jochem, C. M. G., et al., "High-Speed Process For Hermetic Microcrystalline Carbon Coating On Optical Fibres", presented at the Optical Fiber Communication, Houston, Tex., Feb. 6-9, 1989.

*Primary Examiner*—Maura K. Regan
*Attorney, Agent, or Firm*—Brian R. Leslie

[57] ABSTRACT

A method and apparatus for monitoring an electrical property of a conductive coating on an optical fiber, the method comprising capacitively coupling at least one alternating electrical signal into and out of the conductive coating and measuring an electrical property of the coating carrying the alternating electrical signal. The apparatus comprises generating means for generating an alternating electrical signal; capacitive coupling means for capacitively coupling the alternating electrical signal into and out of the conductive coating, the capacitive coupling means being electrically connected to the generating means; and measuring means for measuring an electrical property of the conductive coating carrying the alternating electrical signal, the measuring means being electrically connected to the capacitive coupling means. A method of manufacturing coated optical fiber which incorporates the method of monitoring an electrical property of a conductive coating is also disclosed.

22 Claims, 5 Drawing Sheets

METHOD AND APPARATUS FOR MONITORING AN ELECTRICAL PROPERTY OF A CONDUCTIVE COATING

This application is a continuation of 07/959,726, now abandoned.

BACKGROUND OF THE INVENTION

1. Field of the Invention

This invention relates to the monitoring of electrical properties of conductive coatings, and specifically to the monitoring of such properties of conductive optical fiber coatings.

2. Description of the Prior Art

The environment can damage optical fiber. Water and other chemicals can corrode the fiber. Hydrogen can be absorbed by the fiber and cause light attenuation. To protect optical fiber from these and other environmental influences, a thin hermetic coating may be deposited on the fiber in addition to the standard plastic coating. These hermetic optical fiber coatings are typically made of electrically conductive material, electrically semi-conductive material, or they may be made of a combination of materials in which at least one material is electrically conductive. As used herein to describe coatings, the term "conductive" refers to coatings made of electrically conductive material or electrically semi-conductive material and to coatings made of a combination of materials in which at least one material is electrically conductive.

It is common to deposit an essentially non-conductive outer protective coating made of plastic such as acrylate or silicone over the conductive coating. The outer protective coating prevents damage or removal of the conductive coating during handling or service.

It is well known to those skilled in the art that electrical properties of a conductive coating are influenced by the thickness and/or uniformity of the conductive coating over a given area. For example, if the thickness of a conductive coating increases, the electrical resistance decreases. If the thickness of a conductive coating decreases, the electrical resistance increases. A gap in the conductive coating will also cause the electrical resistance to increase. Furthermore, if a conductive coating consists of a mixture of an electrically conductive material and an electrically non-conductive material, a change in the proportion of the materials will affect the resistance of the conductive coating.

It is known that the thickness and uniformity of conductive coatings can be determined by utilizing the relationship between conductive coating thickness and uniformity and the electrical properties of the conductive coating. The measured electrical values are correlated with the particular conductive coating characteristics desired. For example, the resistance of a conductive coating of unknown thickness and uniformity may be measured by a suitable method. The same method may be used to measure the resistances of similar conductive coatings of known thickness and uniformity. The thickness of these similar conductive coatings can be determined by electron microscopy or other methods. The uniformity of these similar conductive coatings can be determined by chemical analysis or magnified visual inspection. The resistance of the conductive coating of unknown thickness and uniformity is then compared to the resistances of the similar conductive coatings of known thickness and uniformity. In this way the unknown thickness and uniformity can be determined. If such correlations are carried out over a variety of conductive coating thicknesses for a particular conductive coating, an acceptable range of resistivity can be determined which will indicate that conductive coating thickness and uniformity is meeting previously set standards for production or quality assurance.

Several methods of monitoring an electrical property of a conductive coating have been used. In one previously known method, two suitable contacts are connected to a conductive coating at a predetermined distance from each other along the axis of the conductive coating. The contacts are also connected to an ohmmeter. A measurement of resistance between the two contacts is taken. If the conductive coating is covered with an essentially non-conductive outer protective coating, a pair of razor blades can be utilized for the contacts. The razor blades slice through the outer protective coating until making contact with the conductive coating. An apparatus for carrying out this previously known method is illustrated in FIG. 1. Razor blades 71 and 73 are separated by a predetermined length at opposite ends of an insulating block 75 and are respectively connected to ohm-meter means 79. Razor blades 71 and 73 are then brought into contact with optical fiber 77 and linear resistance is measured by ohm-meter 79.

Several disadvantages are associated with methods which utilize physical contact with the conductive coating to measure electrical properties. First, if an outer protective coating covers the conductive coating, the outer protective coating must either be penetrated or removed in order to make electrical contact with the conductive coating. Second, the section of the coated optical fiber utilized to make an electrical measurement is usually destroyed by the physical contact which takes place between the conductive coating and the electrical contacts. Such physical contact may produce a nick or scratch in the conductive coating or in the fiber itself. These injuries can produce flaws in the fiber which result in stress concentrations and breakage. As a result, unless electrical properties are to be measured at the end portions of the fiber, the portion of the fiber used to take electrical measurements must be removed and the remaining segments spliced together. Third, methods utilizing physical contact with the conductive coating can only be performed while the fiber is stationary or moving very slowly. This precludes taking measurements while the fiber is in motion, such as during high speed production of the fiber or when the fiber is being transferred from one reel to another.

A contactless method of monitoring an electrical property of a conductive coating is disclosed in U.S. Pat. No. 5,142,228. The method comprises inductively coupling an AC signal to a conductive coating while simultaneously measuring an electrical value dependent upon the electrical resistivity of the conductive coating then positioned within the inductive coil. An example of such an electrical value is Q. The Q of a reactive circuit element, i.e., a circuit having an inductor (L) or a capacitor (C), is defined as the ratio of the element's reactance (X) to its series resistance:

$$Q = 2\pi \frac{\text{Energy stored per cycle}}{\text{Energy lost per cycle}}$$

For an inductor this is given by:

$$Q = X_L/R = \omega L/R = 2\pi f L/R$$

where L is the inductance, R is the resistance associated with the inductor, $\omega$ is angular velocity and f is the corresponding frequency.

An example of an apparatus for carrying out this method is shown in FIG. 2. This particular apparatus can be used for either static or dynamic monitoring. The apparatus includes inductive coil 81 which is electrically connected by leads 83 to Q-meter means 85. Q-meter means 85 incorporates an analogue or digital display meter means 87 for displaying a measured electrical value (Q) in response to the energizing of inductive coil 81.

Another contactless method of inductively measuring an electrical property of an optical fiber coating is disclosed in U.S. Pat. No. 5,013,130, which teaches using a microwave cavity to generate an electromagnetic field around the coated fiber.

Although inductive methods of measuring electrical properties of conductive coatings are non-destructive, they are also associated with several disadvantages. First, the whole circuit must be highly tuned to get a good measurement. Second, as a conductive coating gets thinner and its resistance increases, the electrical values which characterize the reactive circuit become harder to measure. Therefore, a need exists for a non-inductive method of monitoring an electrical property of a conductive coating which may be utilized without contacting the conductive coating.

SUMMARY OF THE INVENTION

The present invention provides a method and apparatus for capacitively monitoring an electrical property of a conductive coating. More specifically, the present invention provides a method of monitoring an electrical property of a conductive fiber coating wherein the method comprises: capacitively coupling an alternating electrical signal into the conductive coating at a first point; capacitively coupling alternating electrical signal out of the conductive coating at a second point, the second point being situated at a predetermined distance from the first point; and measuring an electrical property of the conductive coating carrying the alternating electrical signal.

The present invention also provides an apparatus for monitoring an electrical property of a conductive coating wherein the apparatus comprises: generating means for generating an alternating electrical signal; capacitive coupling means for capacitively coupling the alternating electrical signal into the conductive coating at a first point and out of the conductive coating at a second point, the first point and the second point being separated from each other by a predetermined distance, the capacitive coupling means being electrically connected to the generating means; and measuring means for measuring an electrical property of the conductive coating carrying the alternating electrical signal, the measuring means being electrically connected to the capacitive coupling means.

Furthermore, the present invention provides a method of manufacturing coated optical fiber, which method incorporates the disclosed method of monitoring an electrical property of a conductive coating. The disclosed method of making coated optical fiber comprises: drawing an optical fiber from an optical fiber preform; placing a conductive coating on the optical fiber; capacitively coupling an alternating electrical signal into the conductive coating at a first point; capacitively coupling alternating electrical signal out of the conductive coating at a second point, the second point being situated at a predetermined distance from the first point; measuring an electrical property of the conductive coating carrying the electrical signal; and modifying at least one processing parameter for controlling at least one of the thickness and/or uniformity of the conductive coating in response to the measured electrical property.

It will be appreciated that the methods and apparatus of the present invention may be employed to monitor an electrical property of a conductive coating which is either uncovered or covered by an essentially non-conductive outer protective coating.

It will be appreciated that the methods and apparatus of the present invention are employed without contacting the conductive coating. It will be further appreciated that the methods and apparatus of the present invention may be employed with or without contact of any essentially non-conductive outer protective coating.

It will be appreciated that the methods and apparatus of the present invention may be employed either while the conductive coating is stationary or while the conductive coating is moving. In the instance where the conductive coating is moving, the methods and apparatus of the present invention are preferably employed without physically contacting any essentially non-conductive outer protective coating.

It is an object of the present invention to provide a non-destructive method and apparatus for monitoring an electrical property of a conductive coating.

It is an object of the present invention to provide a method and apparatus for capacitively monitoring an electrical property of a conductive coating.

It is an object of the present invention to provide a method and apparatus for monitoring an electrical property of a conductive coating while the coating is stationary.

It is an object of the present invention to provide a method and apparatus for monitoring an electrical property of a conductive coating while the coating is moving.

It is an object of the present invention to provide a method and apparatus for monitoring an electrical property of a conductive coating which may be either uncovered or covered by an essentially non-conductive outer protective coating.

It is an object of the present invention to provide a method and apparatus for monitoring an electrical property of a conductive coating which may be employed with or without contact of any essentially non-conductive outer protective coating.

It is an object of the present invention to provide a method of making an optical fiber that is coated with a conductive coating.

DETAILED DESCRIPTION OF THE PREFERRED EMBODIMENTS

Figure 1:
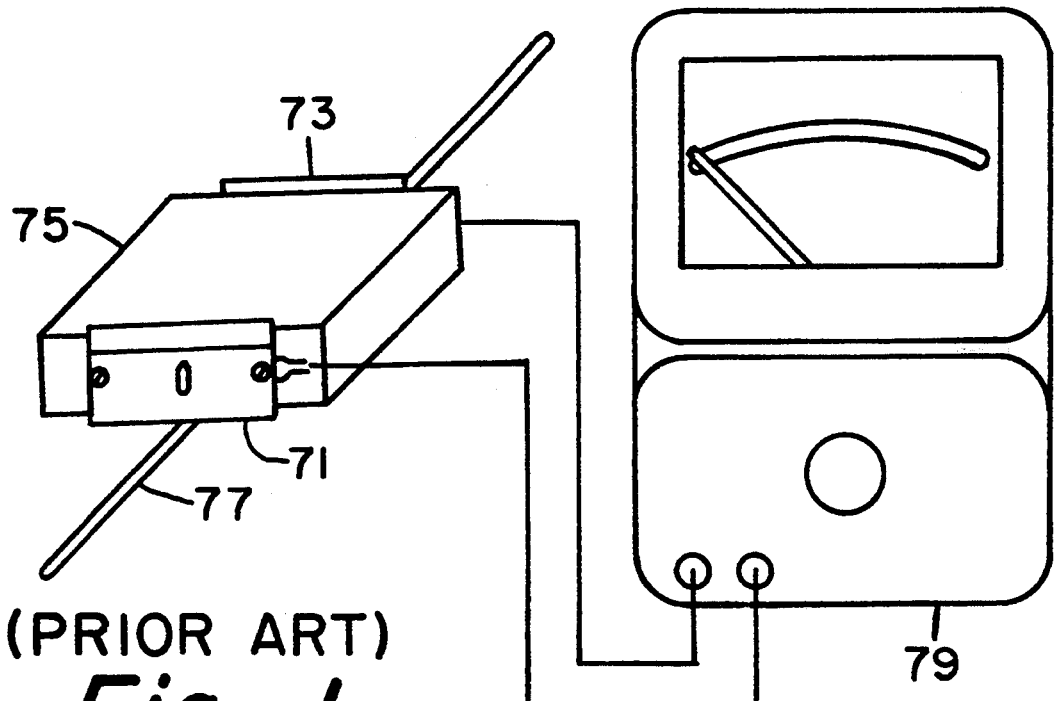
FIG. 1 is a view, partly in perspective, of a prior art arrangement for measuring the electrical resistivity of conductive coatings on optical fibers.
Figure 2:
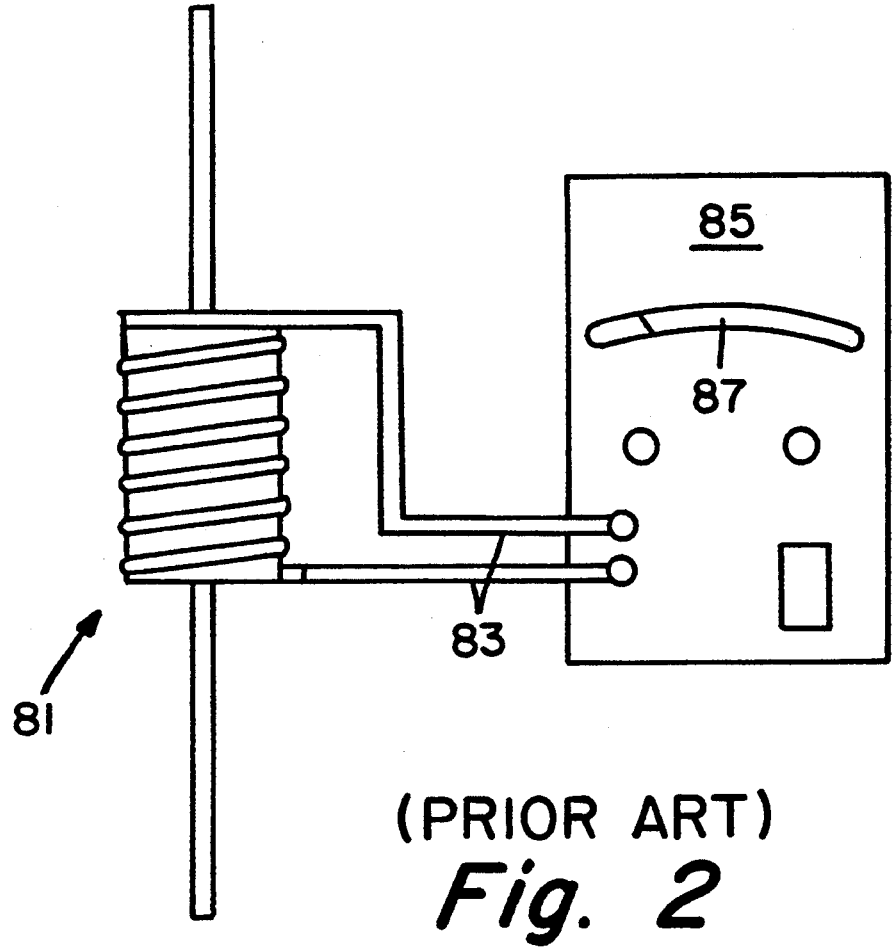
FIG. 2 is a view of an embodiment of an apparatus for monitoring coated fiber disclosed in U.S. Pat. No. 5,142,228.
Figure 3:
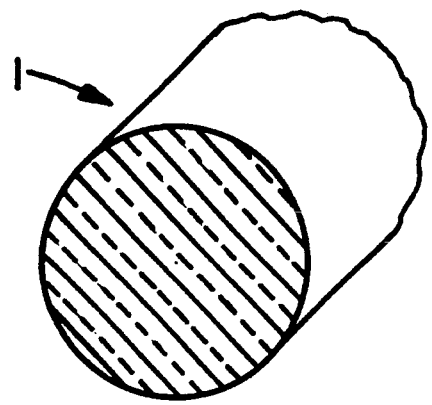
FIG. 3 is an oblique view of a bare optical fiber.
Figure 4:
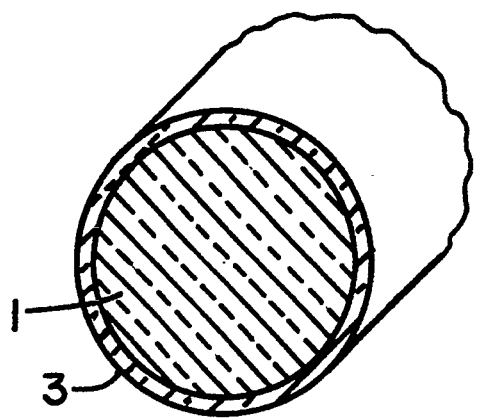
FIG. 4 is an oblique view of an optical fiber having a conductive coating.
Figure 5:
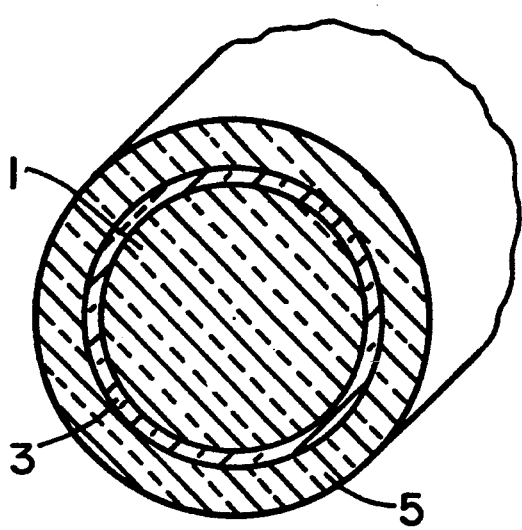
FIG. 5 is an oblique view of an optical fiber having a conductive coating and an essentially non-conductive outer protective coating.

FIGS. 3, 4, and 5 show sections of representative optical fibers in various states.

FIG. 3 shows a bare optical fiber 1. Fiber 1 may be made of any essentially non-electrically conductive material. Fiber 1 may employ any design, such as, for example, a doped or undoped fused silica core surrounded by doped or undoped fused silica cladding (not shown).

FIG. 4 shows a fiber 1 covered by a conductive coating 3. Conductive coating 3 is preferably hermetic. Conductive coating 3 may be applied to fiber 1 by any method as the present invention is not restricted by the method used to apply the conductive coating. Conductive coating 3 is typically less than 3000 angstroms ($3000 \times 10^{-8}$ centimeters) thick.

FIG. 5 shows a fiber 1 covered by conductive coating 3 which is in turn covered by an essentially non-conductive outer protective coating 5. Outer protective coating 5 typically comprises acrylate or silicone compositions. Outer protective coating 5 provides abrasive protection to conductive coating 3, while also providing additional protection to the fiber 1. Outer protective coating 5 is typically applied using a pressurized coating die but may be applied by any method as the present invention is not restricted by the method used to apply the outer protective coating.

Figure 6:
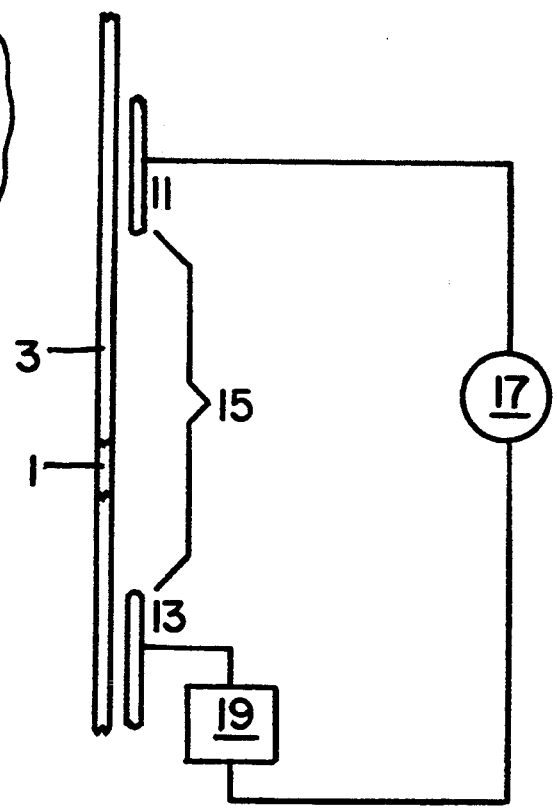
FIG. 6 is a diagrammatic view of an embodiment of the apparatus of the present invention for monitoring a conductive coating and a partially cut-away view of a coated fiber being monitored.

One embodiment of the apparatus of the present invention for monitoring an electrical property of a conductive coating is illustrated diagrammatically in FIG. 6. The capacitive coupling means comprise two conductive plates, an excitation plate 11 and a sense plate 13. The two plates are separated from each other by a predetermined distance 15. The excitation plate 11 is electrically connected to the generating means 17 and capacitively coupled to the conductive coating 3 of optical fiber 1 but not in physical contact with the conductive coating 3, and the sense plate 13 is capacitively coupled to the conductive coating 3 but not in physical contact with the conductive coating 3. The measuring means 19 are electrically connected to the sense plate 13 and measure an electrical property at the sense plate 13.

The generating means may be any device capable of generating an alternating electrical signal including, for example, a current source and a voltage source. The electrical signal is preferably of known and fixed magnitude. The more constant the signal strength is, the more accurate the correlation between the measured electrical property and the conductive coating characteristic.

The excitation plate and the sense plate may be made of any conductive material. The excitation plate and the sense plate may be any shape but preferably surround the fiber so as to provide the greatest possible coupling area. In the present invention the conductive coating may not physically contact the conductive plates. However, the conductive coating may physically contact an essentially non-conductive material interposed between the conductive coating and the conductive plates. The space between the plates and the conductive coating may be filled by any essentially non-conductive medium. This essentially non-conductive medium may be considered as a dielectric in the capacitive couplings. If the plates and the conductive coating are simply spaced at some distance from each other, the dielectric will be air. If the conductive coating is covered by an essentially non-conductive outer protective coating, the dielectric will consist of air and the outer protective coating. If the plates physically contact the outer protective coating, the dielectric will consist solely of the outer protective coating. It will be appreciated by those skilled in the art that other configurations of the present invention can be conceived of which provide additional components which may be considered as a dielectric in the capacitive couplings, such as, for example, an essentially non-conductive coating on the plates. Thus, the present invention provides for totally contactless methods of monitoring an electrical property of a conductive coating and for methods utilizing contact with an essentially non-conductive outer protective coating. In those embodiments where the fiber is moving while the electrical property of the conductive coating is being measured, it is preferred that no contact take place.

It is important that the excitation plate and the sense plate maintain a fairly uniform distance from the fiber. The more uniform this distance remains, the more accurate will be the correlation between electrical property and conductive coating characteristic. If the excitation plate and the sense plate are tubular, the fiber should preferably remain axially centered within the tubular plates. The predetermined distance separating the excitation plate and the sense plate is preferably longitudinal but may be radial or radial and longitudinal. The excitation plate and the sense plate may be held at a specific distance from the fiber and at a predetermined distance from each other by any apparatus which do not prevent capacitive coupling of the alternating current. Apparatus used to hold the excitation plate and the sense plate at a specific distance from the fiber and at a predetermined distance from each other may be interposed between the conductive coating and the excitation and sense plates. If so interposed, the apparatus may be considered as part of the dielectric of the capacitive couplings. An example of such an apparatus is a plastic tube into which the coated fiber is inserted and around which the plates are formed. If the present invention is used on line during fiber production, the size of the excitation plate and the sense plate, and the distance between them, will likely be limited by surrounding structures.

The electrical property being monitored in the present invention may be any electrical property influenced by the conductive coating. Examples include current, voltage, resistance, total impedance, or phase difference between voltage and current. The measuring means of the present invention will depend on the particular electrical property being monitored. For example, if current is being monitored, the measuring means may be a current meter. If voltage is being monitored, the measuring means may be a volt meter.

The measuring means may comprise multiple components. For example, the measuring means may comprise a resistor connected in parallel with an oscilloscope. Additional components may be added to aid in the measurement of the electrical property. For example, converting means for converting current into voltage may be situated between the sense plate and the measuring means. The measured electrical property may be displayed on a screen or recorded or both. It will be appreciated that the present invention encompasses measuring multiple electrical properties.

The measuring means may be electrically connected to the sense plate alone or to both the sense plate and the excitation plate. The preferred configuration will depend on the type of generating means and on the electrical property being measured. For example, if the generating means is a voltage source, it is usually practical to measure current as the electrical property. Therefore, the measuring means may be electrically connected to the sense plate and measure the current at the sense plate. On the other hand, if the generating means is a current source, it is usually practical to measure voltage as the electrical property. In this case, the measuring means may be electrically connected to both the sense plate and the excitation plate and measure voltage across the excitation plate and sense plate.

An essentially non-conductive outer protective coating may cover the conductive coating when employing the methods and apparatus of the present invention. Any such outer coating may be considered as part of the dielectric of the capacitive couplings. When utilizing an embodiment of the present invention to measure an electrical property of a conductive coating on a stationary optical fiber, the conductive coating will typically be covered by an essentially non-conductive outer protective coating. The excitation and sense plates may physically contact the outer protective coating, in which case the outer protective coating becomes all of the dielectric. When in physical contact with the outer protective coating the conductive plates are separated from the conductive coating by an essentially non-conductive medium, and, therefore, a capacitive coupling still takes place.

The excitation plate, the sense plate, and any segment of coated fiber running through and between the excitation plate and the sense plate may be covered by an electrical interference shielding to reduce undesirable electrical interference. However, the shielding itself is likely to be electrically conductive and may consequently have a negative effect on monitoring. Therefore, shielding should only be employed as necessary and to such an extent as to reduce unacceptable interference without unduly limiting monitoring sensitivity.

Figure 7:
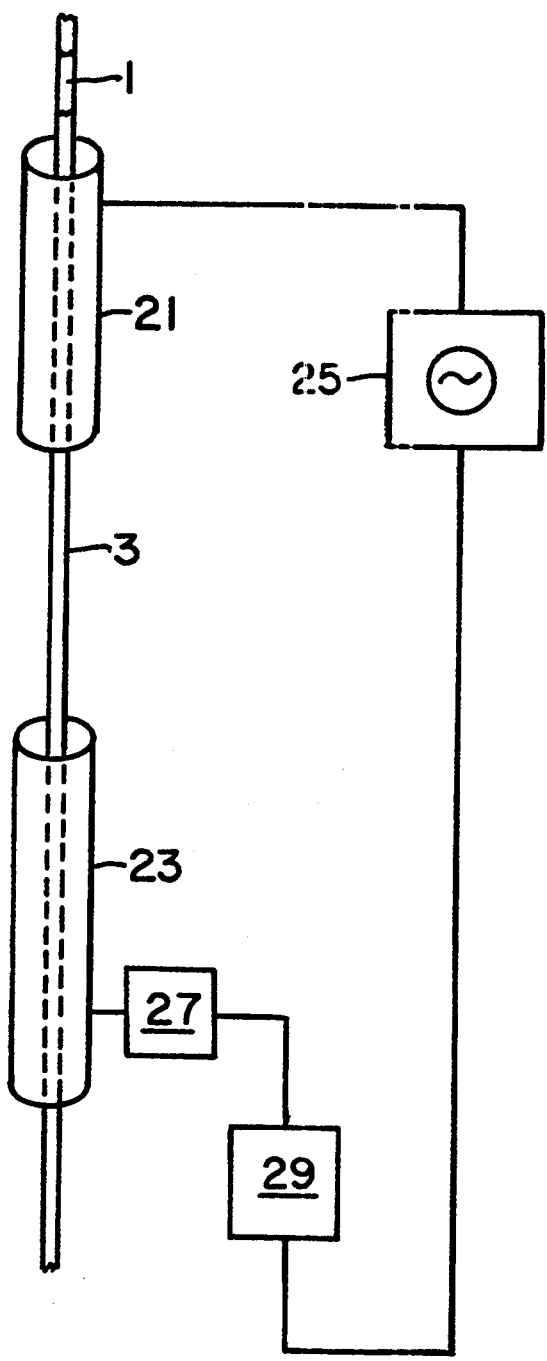
FIG. 7 is a diagrammatic view of a preferred embodiment of the apparatus of the present invention for monitoring a conductive coating and a partially cut-away view of a coated fiber being monitored.

A preferred embodiment of the apparatus of the present invention for monitoring an electrical property of a conductive coating is diagrammatically illustrated in FIG. 7. In this preferred embodiment, the two conductive plates 21 and 23 are tubular and surround the conductive coating 3 such that the fiber 1 is radially situated in the center of the tubular conductive plates 21 and 23. The excitation plate 21 is electrically connected to the generating means 25 and capacitively coupled to the conductive coating 3 of optical fiber 1 but not in physical contact with the conductive coating 3, and the sense plate 23 is capacitively coupled to the conductive coating 3 but not in physical contact with the conductive coating 3. Converting means 27, for converting current flowing from the sense plate 23 into voltage, is situated between the sense plate 23 and the measuring means 29 and is electrically connected to the sense plate 23 and the measuring means 29, the measuring means 29 being electrically connected to the sense plate 23 through the converting means 27.

Figure 10:
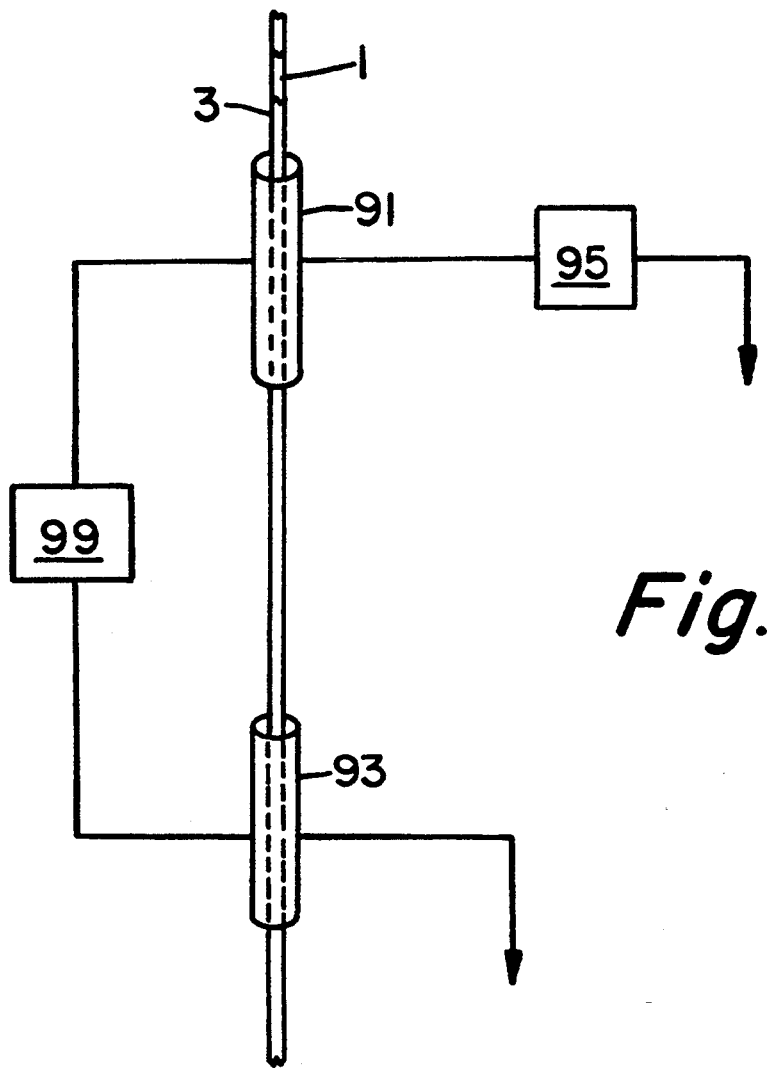
FIG. 10 is a diagrammatic view of an embodiment of the apparatus of the present invention for monitoring a conductive coating and a partially cut-away view of a coated fiber being monitored.

Another embodiment of the apparatus of the present invention for monitoring an electrical property of a conductive coating is diagrammatically illustrated in FIG. 10. The two conductive plates 91 and 93 are tubular and surround the conductive coating 3 such that the fiber 1 is radially situated in the center of the tubular conductive plates 91 and 93. The excitation plate 91 is electrically connected to the generating means 95 and capacitively coupled to the conductive coating 3 of optical fiber 1 but not in physical contact with the conductive coating 3, and the sense plate 93 is capacitively coupled to the conductive coating 3 but not in physical contact with the conductive coating 3. The measuring means 99 are electrically connected to the sense plate 93 and to the excitation plate 91 and measure an electrical property across the sense plate 93 and the excitation plate 91.

A discussion of the theory and operation of the disclosed method and apparatus for monitoring an electrical property of a conductive coating is set forth below.

Figure 8:
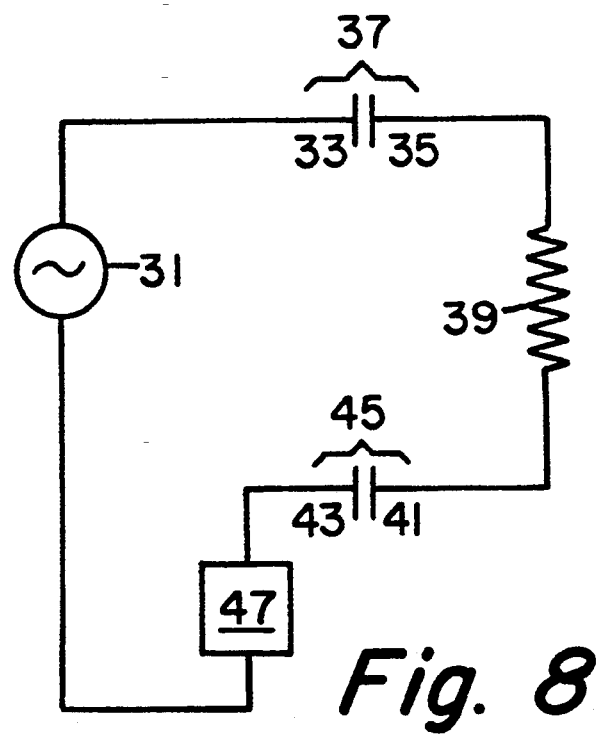
FIG. 8 is an idealized electronic representation of an embodiment of the apparatus of the present invention and a coated fiber being monitored.

An idealized electronic representation of an embodiment of the apparatus of the present invention for monitoring an electrical property of a conductive coating is illustrated in FIG. 8. Generating means 31 generates an alternating electrical signal which travels to excitation plate 33. A first capacitor 37 is formed using the excitation plate 33 as one plate, air as the dielectric, and the conductive coating at a first point 35 as the other plate. The alternating electrical signal is capacitively coupled into the conductive coating 39 via this first capacitor 37. The conductive coating 39 acts as a resistor. The alternating electrical signal travels through the conductive coating 39 until it reaches a second point 41. A second capacitor 45 is formed at the second point 41 using the coating at the second point 41 as one plate, air as the dielectric, and the sense plate 43 as the other plate. The alternating electrical signal is capacitively coupled out of the conductive coating 39 via the second capacitor 45. The alternating electrical signal then flows to measuring means 47 where an electrical property is measured.

It will be appreciated that the embodiment illustrated in FIGS. 8 is presented to demonstrate a general capacitive coupling scheme of the present invention. Other circuits can perform the methods of the present invention, and these circuits are encompassed by the present invention.

It will be appreciated that, if an essentially non-conductive outer protective coating covers the conductive coating, the outer protective coating becomes part of the dielectric of the two capacitors which are formed by the conductive coating and the excitation and sense plates. The excitation plate and the sense plate may contact the essentially non-conductive outer protective coating, in which case the outer protective coating becomes the entire dielectric of the capacitors. It will be appreciated that if the excitation plate and the sense plate are in contact with the outer protective coating, they are not in physical contact with the conductive coating.

A change in the thickness and/or uniformity of a conductive coating results in a change in the resistance of the conductive coating. The resistance for a given segment of conductive coating is characterized as:

$$R = PL/A_x$$

where R is the resistance of the conductive coating, P is the resistivity of the conductive coating material, L is the length of conductive coating, and $A_x$ is the cross-sectional area of conductive coating measured perpendicular to the longitudinal axis of the fiber. If the thickness of the conductive coating decreases, the cross-sectional area $A_x$ decreases. This causes the resistance R to increase. If the thickness of the conductive coating increases, the cross sectional area $A_x$ increases. This causes the resistance R to decrease.

Because the excitation plate and the sense plate are not in direct contact with the conductive coating, the resistance R of the conductive coating can not be measured independent of a total impedance which includes the effects of the capacitors which are formed by the conductive coating and the excitation and sense plates. The total impedance of the circuit, not including any resistance from the measuring means or additional components, may be characterized as:

$$Z = X_{c1} + R + X_{c2}$$

wherein Z is the total impedance, $X_{c1}$ is the capacitive reactance of the first capacitor, R is the resistance of the conductive coating, and $X_{c2}$ is the capacitive reactance of the second capacitor. Thus, if the capacitive reactances $X_{c1}$ and $X_{c2}$ of the two capacitors are held relatively constant, changes in the resistance R of the conductive coating caused by changes in thickness and/or uniformity will be shown in the total impedance Z.

The total impedance Z of the circuit is easily determined based on the relationship:

$$Z = V_{sense}/I_{total}$$

where $V_{sense}$ is the voltage at the sense plate and $I_{total}$ is the total current of the circuit.

The relationship between the resistance R and the total impedance makes the method of the present invention very suitable for use with thin coatings. As stated hereinabove, the resistance R of the conductive coating increases as the thickness (and, therefore, cross-sectional area $A_x$) decreases. For thinner coatings, the resistance R is a larger component of the total impedance Z. Therefore, changes in the total impedance Z become more directly related to changes in the resistance R of the conductive coating.

To optimize the sensitivity of the present invention, the resistance R of the circuit should be optimized and the capacitive reactances $X_{c1}$ and $X_{c2}$ of the capacitors should be minimized. Capacitive reactance may be characterized as:

$$X_c = \tfrac{1}{2}\pi F C_c$$

where $X_c$ is the capacitive reactance of a capacitor c, F is the frequency of operation and $C_c$ is the capacitance of the capacitor c. The value of $X_c$ may be minimized by increasing the frequency F of operation. As the frequency of the alternating current rises, the values for $X_{c1}$ and $X_{c2}$ decrease. The resistance R of the conductive coating is not affected by a rise or fall in frequency. Thus, at higher frequencies, the resistance R of the conductive coating becomes a larger component of the total impedance Z. However, at some point as the frequency rises, the electronics required to measure the electrical property become more complex since they must be able to handle the higher frequencies generated. The preferred frequency range of the present invention is between 250 KHz and 1 MHz.

Another way to minimize the capacitive reactances $X_{c1}$ and $X_{c2}$ is to increase the capacitances $C_{c1}$ and $C_{c2}$ of the first and second capacitors. The capacitance C for a cylindrical capacitor is characterized as:

$$C = 2\pi\epsilon L/(ln(b/a))$$

where $\epsilon$ is the dielectric constant, L is the length of the capacitor, b is the radius of the outer plate, and a is the radius of the inner plate. The terms which may be physically varied to increase the capacitance C are $\epsilon$, L, and b. An 80-fold increase in capacitance C results if water ($\epsilon = 7.08 \times 10^{-10}$) is used as the dielectric instead of air ($\epsilon = 8.85 \times 10_{-12}$). The capacitance C varies linearly with the length L of the capacitor. The capacitance C is increased by bringing the plate closer to the conductive coating, and thereby decreasing the radius of the outer plate b.

If an embodiment utilizing tubular conductive plates is used, it is preferred that the fiber remain substantially in the center of the tubular plates. Otherwise the capacitance will vary, making an accurate measurement more difficult.

Another way to increase the portion of the total circuit impedance contributed to by the conductive coating resistance is to increase the length of the conductive coating between the excitation plate and the sense plate. This is apparent from the characterization of resistance R as:

$$R = PL/A_x$$

which is discussed hereinabove. In on-line use, the distance between the excitation plate and the sense plate will probably be limited by surrounding structures.

All of the variables discussed above may be manipulated to provide the greatest sensitivity for the particular apparatus and coated fiber used.

One embodiment of the method of the present invention allows the resistance of the conductive coating alone to be determined. This embodiment comprises capacitively coupling multiple alternating electrical signals of different frequencies into the conductive coating at the first point; capacitively coupling multiple alternating electrical signals out of the conductive coating at the second point; and measuring an electrical property of the conductive coating carrying the multiple alternating electrical signals at each of the frequencies at which the multiple alternating electrical signals were generated. By filtering the signals coupled out of the conductive coating into their individual frequencies and measuring the electrical properties at the individual frequencies, multiple additional points of data can be generated. These additional points of data allow a total impedance value to be generated for each frequency. With two or more values for the total impedance of the circuit, the capacitive reactance terms can be canceled out algebraically, leaving the resistance of the conductive coating alone.

It will be appreciated that the methods of monitoring an electrical property of a conductive coating disclosed by the present invention may be beneficially incorporated into a method of making a coated optical fiber. The method of monitoring an electrical property of a conductive coating provides information which allows continual modification of one or more processing parameters for controlling the thickness and/or uniformity of the conductive coating.

Figure 9:
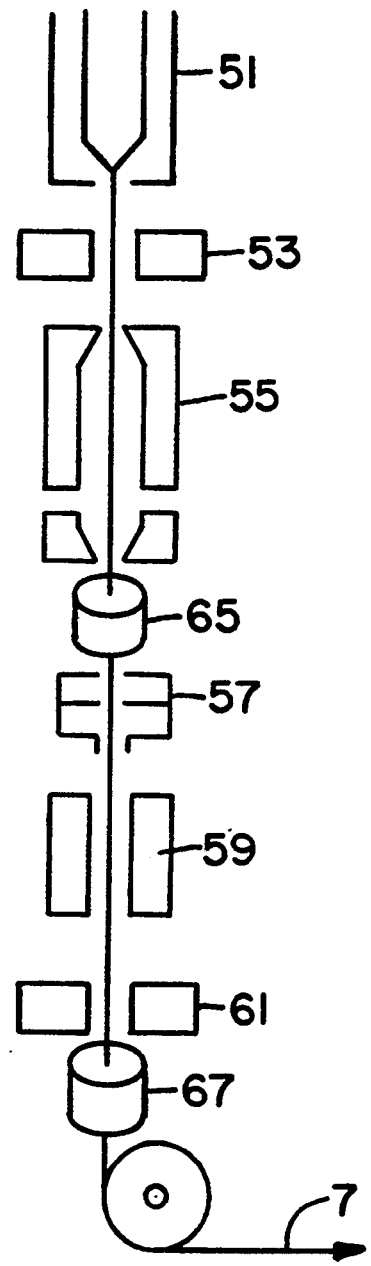
FIG. 9 is a diagrammatic view of an optical fiber drawing and coating line and a fiber being drawn and coated with exemplary placements of an appropriate embodiment of the apparatus of the present invention.

FIG. 9 shows a schematic for an embodiment of an optical fiber manufacturing line which incorporates an apparatus of the present invention for monitoring an electrical property of the conductive coating. Furnace means 51 heats optical fiber material to temperatures great enough to allow bare fiber to be drawn. Bare fiber diameter monitor means 53 measures whether bare fiber 1 is being drawn to a proper outside diameter. Reactor means 55 places a conductive coating 3 upon bare fiber 1. Outer protective coating applicator means 57 is used to place outer protective coating 5 upon conductive coating 3. Curing means 59 cures protective coating 5. Coated fiber diameter monitor means 61 measures whether coated fiber 7 is a proper outside diameter. Coated fiber 7 is then wound onto a take up spool or reel.

An embodiment of the apparatus of the present invention may be installed anywhere along the drawing line subsequent to reactor 55. For example, an embodiment of the apparatus of the present invention could be installed at position 65 or position 67 as shown in FIG. 9. Alternatively, multiple apparatus could be positioned in the drawing line for redundant monitoring or to monitor different electrical properties. Typically, an apparatus of the present invention will be used on-line prior to covering the conductive coating with an outer protective coating.

EXAMPLE 1

A 20 volt peak-to-peak sinusoidal oscillator running at a fixed frequency of 250 KHz was electrically connected to an aluminum electrode. The electrode was flat, two inches in length, and had a groove to accept a fiber. An identical aluminum electrode was separated from the first electrode by eight inches. The second electrode was electrically connected to an RMS (root mean square) current meter having a voltage output analog of the measured current.

A hermetically coated fiber which had a conductive coating and an essentially non-conductive outer protective coating was placed between the aluminum electrodes. The coated fiber remained stationary between the aluminum electrodes. The electrodes made physical contact with the outer protective coating but not with the conductive coating. The oscillator was energized and the current was measured by the current meter with the voltage output analog. The pure resistance of the conductive coating was measured by independent means.

The above procedure was repeated for a series of hermetically coated fibers which had a conductive coating and an essentially non-conductive outer protective and an essentially non-conductive outer protective coating. A relationship was established between the pure resistance of the conductive coatings and the current measured by the RMS current meter with the voltage output analog. This relationship is depicted in FIG. 11.

Figure 11:
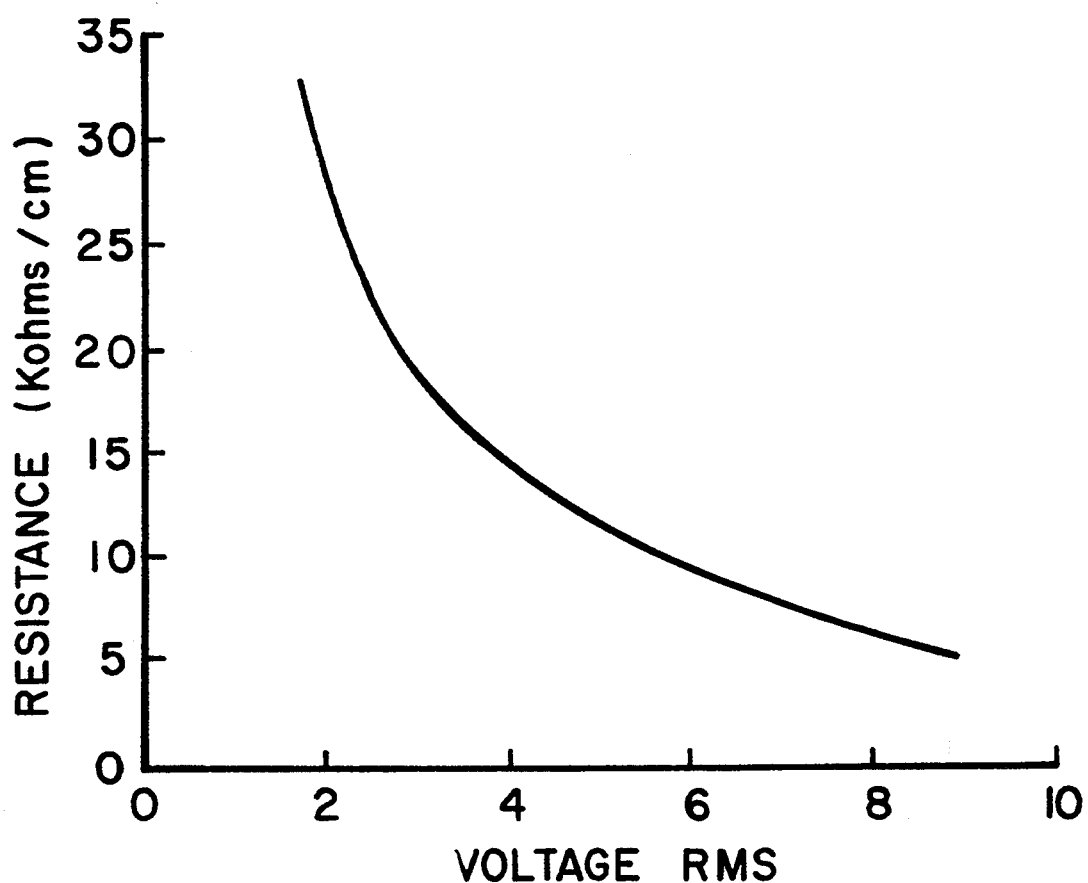
FIG. 11 is a graph illustrating the relationship established between the pure resistance of selected conductive coatings and the current measured by an embodiment of the present invention for those conductive coatings.

The relationship of FIG. 11 allowed unknown resistances of conductive coatings to be determined by measuring the current generated by the apparatus above for the respective coated fiber and extrapolating the corresponding resistance. As the observed relationship was non-linear in nature, a micro-processor based system was used to calculate the resistance of the conductive coating.

EXAMPLE 2

An apparatus for monitoring an electrical property of a coated optical fiber while the coated optical fiber is moving can be manufactured as described above in Example 1 except that the aluminum electrodes will be tubular and the coated fiber will move through the center of the two tubular electrodes. In such an apparatus, neither the conductive coating nor the essentially non-conductive outer protective coating will physically contact any part of the apparatus.

Although the present invention has been shown and described with respect to detailed embodiments thereof, it will be understood by those skilled in the art that various changes in the form and detail thereof may be made without departing from the spirit and scope of this invention.

We claim:

1. An apparatus for monitoring an electrical property of a conductive coating on an optical fiber, the apparatus comprising:

generating means for generating an alternating electrical signal of between 250 KHz and 1 MHz;

capacitive coupling means for capacitively coupling the alternating electrical signal into the conductive coating at a first point and out of the conductive coating at a second point, the conductive coating being less than 3000 Angstroms thick, the first point and the second point being separated from each other by a predetermined distance, and the capacitive coupling means being electrically connected to the generating means; and measuring means for measuring an electrical property of the conductive coating carrying the alternating electrical signal, the measuring means being electrically connected to the capacitive coupling means.

2. The apparatus of claim 1, wherein the capacitive coupling means comprise two conductive plates, an excitation plate and a sense plate, the two plates being separated from each other by a predetermined distance, the excitation plate being electrically connected to the generating means and capacitively coupled to the conductive coating but not in physical contact with the conductive coating, and the sense plate being capacitively coupled to the conductive coating but not in physical contact with the conductive coating; and the measuring means are electrically connected to at least the sense plate and measure an electrical property of the conductive coating carrying the alternating electrical signal.

3. The apparatus of claim 2, wherein
the two conductive plates are tubular and surround the conductive coating such that the fiber is radially situated in the center of the tubular conductive plates.

4. The apparatus of claim 2, wherein
the generating means is a voltage source.

5. The apparatus of claim 4, further comprising
converting means for converting current flowing from the sense plate into voltage, the converting means being situated between the sense plate and the measuring means and being electrically connected to the sense plate and the measuring means, the measuring means being electrically connected to the sense plate through the converting means.

6. The apparatus of claim 2, wherein
the generating means is a current source.

7. The apparatus of claim 6, wherein
the measuring means are electrically connected to the sense plate and to the excitation plate.

8. A method of monitoring an electrical property of a conductive optical fiber coating, the method comprising:
capacitively coupling an alternating electrical signal into the conductive coating at a first point, the conductive coating being less than 3000 Angstroms thick,;
capacitively coupling alternating electrical signal out of the conductive coating at a second point, the second point being situated at a predetermined distance from the first point; and
measuring an electrical property of the conductive coating carrying the alternating electrical signal.

9. The method of claim 8, including
capacitively coupling the alternating electrical signal into the conductive coating at the first point using an excitation plate, the excitation plate being a conductive plate which does not physically contact the conductive coating; and
capacitively coupling the alternating electrical signal out of the conductive coating at the second point using a sense plate, the sense plate being a conductive plate which does not physically contact the conductive coating, the sense plate and the excitation plate being separated by a predetermined distance.

10. The method of claim 9, including
capacitively coupling the alternating electrical signal into the conductive coating at the first point using an excitation plate which is tubular and which surrounds the fiber without physically contacting the conductive coating; and
capacitively coupling the alternating electrical signal out of the conductive coating at the second point using a sense plate which is tubular and which surrounds the fiber without physically contacting the conductive coating.

11. The method of claim 9, including
measuring the electrical property at the sense plate.

12. The method of claim 11, including
converting current flowing out of the conductive coating at the second point into voltage; and
measuring the voltage.

13. The method of claim 9, including
measuring the electrical property across the sense plate and excitation plate.

14. The method of claim 10, including
moving the coated fiber longitudinally through the center of the two tubular plates as the electrical property is measured.

15. The method of claim 8, including
capacitively coupling multiple alternating electrical signals of different frequencies into the conductive coating at the first point;
capacitively coupling multiple alternating electrical signals out of the conductive coating at the second point; and
measuring an electrical property of the conductive coating carrying the multiple alternating electrical signals at each of the frequencies at which the multiple alternating electrical signals were generated.

16. A method of making a coated optical fiber, the method comprising:
drawing an optical fiber from an optical fiber preform;
placing a conductive coating less than 3000 Angstroms thick on the drawn fiber;
capacitively coupling an alternating electrical signal into the conductive coating at a first point;
capacitively coupling alternating electrical signal out of the conductive coating at a second point, the second point being situated at a predetermined distance from the first point;
measuring an electrical property of the conductive coating carrying the alternating electrical signal; and
modifying at lease one processing parameter for controlling at least one of the thickness and/or uniformity of the conductive coating in response to the measured electrical property.

17. The method of claim 16, including
capacitively coupling the alternating electrical signal into the conductive coating at the first point using an excitation plate, the excitation plate being a conductive plate which does not physically contact the conductive coating; and
capacitively coupling the alternating electrical signal out of the conductive coating at the second point using a sense plate, the sense plate being a conductive plate which does not physically contact the conductive coating, the sense plate and the excitation plate being separated by a predetermined distance.

18. The method of claim 17, including
capacitively coupling the alternating electrical signal into the conductive coating at the first point using an excitation plate which is tubular and which surrounds the fiber without physically contacting the conductive coating; and
capacitively coupling the alternating electrical signal out of the conductive coating at the second point using a sense plate which is tubular and which surrounds the fiber without physically contacting the conductive coating.

19. The method of claim 17, including
measuring the electrical property at the sense plate.

20. The method of claim 19, including
converting current flowing out of the conductive coating at the second point into voltage; and
measuring the voltage.

21. The method of claim 17, including
measuring the electrical property across the sense plate and excitation plate.

22. The method of claim 16, including
placing an essentially non-conductive outer protective coating over the conductive coating.

* * * * *